(12) United States Patent
Jeong et al.

(10) Patent No.: US 8,803,174 B2
(45) Date of Patent: Aug. 12, 2014

(54) LIGHT EMITTING DEVICE, LIGHT EMITTING DEVICE PACKAGE

(75) Inventors: Hwan Hee Jeong, Seoul (KR); Sang Youl Lee, Seoul (KR); Ji Hyung Moon, Seoul (KR); June O Song, Seoul (KR); Kwang Ki Choi, Seoul (KR); Dae Sung Kang, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 327 days.

(21) Appl. No.: 13/040,984

(22) Filed: Mar. 4, 2011

(65) Prior Publication Data

US 2011/0215352 A1    Sep. 8, 2011

(30) Foreign Application Priority Data

Mar. 5, 2010   (KR) ........................ 10-2010-0019771

(51) Int. Cl.
*H01L 33/00*    (2010.01)
*H01L 33/62*    (2010.01)
*H01L 33/36*    (2010.01)
*H01L 33/44*    (2010.01)

(52) U.S. Cl.
CPC ............ *H01L 33/0079* (2013.01); *H01L 33/62* (2013.01); *H01L 33/36* (2013.01); *H01L 33/44* (2013.01)
USPC ................... 257/98; 257/94; 257/95; 257/99

(58) Field of Classification Search
CPC ..... H01L 33/0079; H01L 33/62; H01L 33/36; H01L 33/44
USPC ..................... 257/79, 90, 94, 95, 98, 99, 103
See application file for complete search history.

(56) References Cited

U.S. PATENT DOCUMENTS

| | | | | |
|---|---|---|---|---|
| 6,150,672 | A  * | 11/2000 | Kaneko ........................ | 257/94 |
| 7,776,637 | B2 | 8/2010 | Leem | |
| 8,058,147 | B2 * | 11/2011 | Herrmann et al. ............ | 438/458 |
| 2003/0160229 | A1 * | 8/2003 | Narayan et al. ................. | 257/14 |
| 2005/0279088 | A1 | 12/2005 | Kim | |
| 2007/0145391 | A1 * | 6/2007 | Baik et al. ....................... | 257/94 |
| 2007/0295952 | A1 * | 12/2007 | Jang et al. ....................... | 257/15 |
| 2008/0258133 | A1 | 10/2008 | Seong | |
| 2008/0258151 | A1 | 10/2008 | Kim | |
| 2009/0028202 | A1 * | 1/2009 | Jeong ......................... | 372/45.01 |
| 2009/0239320 | A1 | 9/2009 | Takayama et al. | |

FOREIGN PATENT DOCUMENTS

| | | | |
|---|---|---|---|
| CN | 1870312 | A | 11/2006 |
| CN | 101238593 | A | 8/2008 |
| CN | 101371370 | A | 2/2009 |
| CN | 101494268 | A | 7/2009 |
| KR | 10-2005-0060740 | A | 6/2005 |
| KR | 10-2005-0090816 | | 9/2005 |
| KR | 10-0663016 | B1 | 12/2006 |

(Continued)

*Primary Examiner* — Shouxiang Hu
(74) *Attorney, Agent, or Firm* — McKenna Long & Aldridge LLP

(57) ABSTRACT

Disclosed is a method of manufacturing a light emitting device. The light emitting device includes a nitride semiconductor layer, an electrode on the nitride semiconductor layer, a light emitting structure including a first conductive type semiconductor layer, an active layer, and a second conductive type semiconductor layer under the nitride semiconductor layer, and a conductive layer under the light emitting structure. The nitride semiconductor layer has band gap energy lower than band gap energy of the first conductive type semiconductor layer.

20 Claims, 9 Drawing Sheets

(56) References Cited

FOREIGN PATENT DOCUMENTS

| KR | 10-0784383 | 12/2007 |
| KR | 10-2008-0050159 A | 6/2008 |
| KR | 20080050159 | 6/2008 |
| KR | 20080050159 A | 6/2008 |
| KR | 10-0843408 | 7/2008 |
| KR | 10-0939929 | 2/2010 |
| TW | 200746231 | 12/2007 |

* cited by examiner

LIGHT EMITTING DEVICE, LIGHT EMITTING DEVICE PACKAGE

The present application claims priority of Korean Patent Application No. 10-2010-0019771 filed on Mar. 5, 2010, which is hereby incorporated by reference in its entirety.

BACKGROUND

The embodiment relates to a light emitting device, a method of manufacturing the same, and a light emitting device package.

A light emitting diode (LED) is a semiconductor light emitting device that converts current into light. The LED can generate light having high brightness, so that the LED has been expensively used as a light source for a display device, a vehicle, or a lighting device. In addition, the LED can represent a white color having superior light efficiency by employing phosphors or combining LEDs having various colors.

In order to improve the brightness and the performance of the LED, various attempts have been performed to improve a light extracting structure, an active layer structure, current spreading, an electrode structure, and a structure of a light emitting diode package.

SUMMARY

The embodiment provides a light emitting device capable of improving reliability and a method of manufacturing the same.

The embodiment provides a light emitting device and a method of manufacturing the same, in which a growth substrate is divided, According to the embodiment, the light emitting device includes a nitride semiconductor layer; an electrode on the nitride semiconductor layer; a light emitting structure under the nitride semiconductor layer, the light emitting structure including a first conductive type semiconductor layer, a second conductive type semiconductor layer, and an active layer between the first and a second conductive type semiconductor layers; and a conductive layer under the light emitting structure. The nitride semiconductor layer has band gap energy lower than band gap energy of the first conductive type semiconductor layer.

According to the embodiment, the light emitting device includes a nitride semiconductor layer including a plurality of holes; a current spreading layer on the nitride semiconductor layer; an electrode on the current spreading layer; a light emitting structure under the nitride semiconductor layer, the light emitting structure including a first conductive type semiconductor layer, a second conductive type semiconductor layer, and an active layer between the first and a second conductive type semiconductor layers; and a conductive layer under the light emitting structure, the conductive layer including a reflective layer, wherein the nitride semiconductor layer has band gap energy lower than band gap energy of the first conductive type semiconductor layer.

According to the embodiment, the light emitting device package includes a body; a first and second lead electrode on the body; a light emitting device on at least one of the first and second lead electrodes; and a molding member covering the light emitting device, wherein the light emitting device comprises: a nitride semiconductor layer; an electrode on the nitride semiconductor layer; a light emitting structure under the nitride semiconductor layer, the light emitting structure including a first conductive type semiconductor layer, a second conductive type semiconductor layer, and an active layer between the first and a second conductive type semiconductor layers; and a conductive layer under the light emitting structure, wherein the nitride semiconductor layer has band gap energy lower than band gap energy of the first conductive type semiconductor layer.

According to the embodiment, a method of manufacturing a light emitting device includes forming a spreading layer on a substrate, forming a sacrificial layer on the spreading layer, forming a light emitting structure on the sacrificial layer, forming a conductive support member on the light emitting structure, and separating the substrate by irradiating a laser beam into a lower portion of the substrate to decompose the sacrificial layer. Band gap energy of the spreading layer is greater than energy of the laser beam, and thermal conductivity of the spreading layer is greater than thermal conductivity of the substrate.

DETAILED DESCRIPTION OF THE EMBODIMENTS

Figure 1:
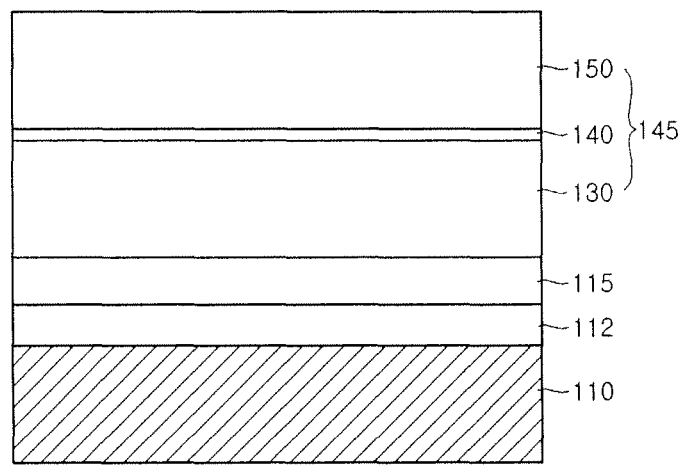
FIGS. 1 to 5 are views showing a method of manufacturing a light emitting device according to a first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, a method of manufacturing a light emitting device according to the embodiment will be described with reference to accompanying drawings.

FIGS. 1 to 5 are views showing the method of manufacturing the light emitting device according to the embodiment.

Referring to FIG. 1, a plurality of nitride-based semiconductor layers are formed on a substrate 110.

For instance, the nitride-based semiconductor layers may include nitride semiconductor materials having a compositional formula of $In_xAl_yGa_{1-x-y}N$ ($0 \leq x \leq 1$, $0 \leq y \leq 1$, $0 \leq x+y \leq 1$).

The nitride-based semiconductor layers include a spreading layer 112, a sacrificial layer 115 on the spreading layer 112, a first semiconductor layer 130 on the sacrificial layer 115, an active layer 140 on the first semiconductor layer 130, and a second conductive type semiconductor layer 150 on the active layer 140, but the embodiment is not limited thereto.

A light emitting structure 145 includes the first semiconductor layer 130, the active layer 140, and the second conductive type semiconductor layer 150 to generate light.

Lattice constants of the spreading layer 112 and the sacrificial layer 115 may have the intermediate value between lattice constants of the substrate 110 and the light emitting structure 145. The sacrificial layer 115 may have a lattice constant lower than that of the light emitting structure 145. The spreading layer 112 and the sacrificial layer 115 may reduce defects and dislocations caused by the lattice constant difference between the light emitting structure 145 and the substrate 110.

The spreading layer 112 and the sacrificial layer 115 allow the substrate 110 to be stably separated from the light emitting structure 145 through a laser lift off process which is the subsequent process. Accordingly, the spreading layer 112 and the sacrificial layer 115 protect the light emitting structure 145 and enable the substrate 110 to be reused, and the details thereof will be described below.

For instance, the substrate 110 may include at least one selected from the group consisting of sapphire ($Al_2O_3$), SiC, Si, GaAs, GaN, ZnO, Si, GaP, $LiAl_2O_3$, InP, BN, AlN and Ge.

In order to prevent the substrate 110 from being damaged due to a laser beam, the band gap energy of the substrate 110 may be greater than the energy of a laser beam used in the LLO process to be described later.

For example, the band gap energy of the substrate 110 may be at least about 6.5 eV. Preferably, the band gap energy of the substrate 110 may be about 7 eV or more. Hereinafter, the embodiment will be described while focusing on that the substrate 110 includes sapphire ($Al_2O_3$) having the band gap energy of about 9.5 eV to about 10.5 eV, but the embodiment is not limited thereto.

Meanwhile, the substrate 110 may include a PSS (Patterned Sapphire Substrate) having a pattern, or a top surface of the substrate 110 may be inclined at a predetermined angle with respect to a main surface, but the embodiment is not limited thereto. The pattern may have a light extraction structure such as a concavo-convex pattern, and may have a hemispherical shape or a polygonal shape.

The nitride-based semiconductor layers may be formed on the substrate 110 through an MOCVD (Metal Organic Chemical Vapor Deposition) scheme, a CVD (Chemical Vapor Deposition) scheme, a PECVD (Plasma-Enhanced Chemical Vapor Deposition) scheme, and an MBE (Molecular Beam Epitaxy) scheme, an HVPE (Hydride Vapor Phase Epitaxy) scheme, but the embodiment is not limited thereto.

The spreading layer 112 may include a nitride semiconductor material having a compositional formula of $In_xAl_yGa_{1-x-y}N$ (0≤x≤0.5, 0.15≤y≤1, 0≤x+y≤1). The spreading layer 112 may include a material having band gap energy greater than that of the sacrificial layer 115 and less than the laser energy. For example, the band gap energy of the spreading layer 112 may be at least 3.5 eV. Preferably, the band gap energy of the spreading layer 112 may be at least 5 eV.

If the spreading layer 112 is formed through the MOCVD scheme, at least one of trimethyl gallium (TMGa) gas, trimethyl indium (TMIn) gas, trimethyl aluminum (TMAl) gas, ammonia (NH3) gas, nitrogen (N2) gas, and hydrogen (H2) gas is injected in a chamber, but the embodiment is not limited thereto.

The spreading layer 112 reduces lattice constant mismatch between the substrate 110 and the light emitting structure 145. In addition, the spreading layer 112 allows laser energy irradiated in the LLO process to be described later to be spread throughout the whole region of the sacrificial layer 115, so that the reliability for the LLO process can be improved.

To this end, the thermal conductivity of the spreading layer 112 may be greater than that of the substrate 110. The laser energy is converted into thermal energy of the spreading layer 112. Since the spreading layer 112 has high thermal conductivity, the thermal energy is effectively spread throughout the whole region so that the thermal energy can be transferred to the sacrificial layer 115.

The thermal conductivity of the spreading layer 112 may be adjusted according to the content of aluminum (Al) contained in the spreading layer 112. For example, if the substrate 110 includes $Al_2O_3$, the thermal conductivity of the substrate 100 may be in the range of about 0.4 W/cm·K to about 0.5 W/cm·K. Preferably, the spreading layer 112 may include a material having the thermal conductivity in the range of about 1.5 W/cm·K to about 3.5 W/cm·K and greater than the thermal conductivity of the substrate 110. Accordingly, the energy applied from a laser is uniformly spread throughout the whole region of the spreading layer 112, so that the reliability for the LLO process to be described later will be improved.

In order to allow the spreading layer 112 to sufficiently perform the intrinsic function thereof, the spreading layer 112 may have a thickness of at least 5 nm. Preferably, the spreading layer 112 may have a thickness of at least 10 nm. More preferably, the spreading layer 112 may have a thickness in the range of about 20 nm to about 100 nm.

Meanwhile, the spreading layer 112 may include a plurality of layers or may not include a plurality of layers. For example, the spreading layer 112 includes a first layer including AlN, a second layer including AlGaN, and a third layer including InGaN, but the embodiment is not limited thereto.

If the spreading layer 112 includes a plurality of layers, the band gap energy of the layers may be gradually increased or decreased as the layers are away from the substrate 110, but this may be changed according to the design of the light emitting device according to the embodiment.

The sacrificial layer 115 may be formed on the spreading layer 112. The sacrificial layer 115 may include a nitride semiconductor material having a composition formula of $In_xAl_yGa_{1-x-y}N$ (0.15≤x≤1, 0≤y≤0.15, 0≤x+y≤1). The sacrificial layer 115 may include a nitride semiconductor layer, and has band gap energy lower than that of the light emitting structure 145, for example, a GaN-based semiconductor layer. The sacrificial layer 115 may include a material having band gap energy lower than the band gap energy of the spreading layer 112 and the laser energy. For example, the band gap energy of the sacrificial layer 115 may be in the range of about 1 eV to about 4 eV. Preferably, the band gap energy of the sacrificial layer 115 may be in the range of about 1 eV to about 3 eV.

If the sacrificial layer 115 is formed through the MOCVD scheme, at least one of TMGa gas, TMIn gas, TMAl gas, $NH_3$ gas, $N_2$ gas, and $H_2$ gas may be injected in a chamber, but the embodiment is not limited thereto.

The sacrificial layer 115 absorbs thermal energy formed by the energy of a laser beam irradiated in the LLO process to be described later and is decomposed by the thermal energy, so that the substrate 110 is separated from the light emitting structure 145.

Accordingly, the sacrificial layer 115 preferably includes a material having a high thermal absorption coefficient, and the thickness of the sacrificial layer 115 may be at least 50 nm, preferably, 100 nm or more.

Meanwhile, the sacrificial layer 115 may include a plurality of layers. The layers include a first layer including InN and a second layer including InGaN, but the embodiment is not limited thereto.

The light emitting structure 145 may be formed on the sacrificial layer 115. The light emitting structure 145 includes the first semiconductor layer 130, the active layer 140 on the first semiconductor layer 130 and the second conductive type semiconductor layer 150 on the active layer 140.

The first semiconductor layer 130 may include only a first conductive type semiconductor layer, or may further include a non-conductive type semiconductor layer under the first conductive type semiconductor layer, but the embodiment is not limited thereto.

For example, the first conductive type semiconductor layer may include at least one N type semiconductor layer. The N type semiconductor layer may include a semiconductor material having a compositional formula of $In_xAl_yGa_{1-x-y}N$ ($0 \leq x \leq 1$, $0 \leq y \leq 1$, $0 \leq x+y \leq 1$). For example, the N type semiconductor layer may be selected from the group consisting of InAlGaN, GaN, AlGaN, InGaN, AlN, InN, and AlInN, and may be doped with N type dopants such as Si, Ge, and Sn.

If the MOCVD scheme is formed, the first conductive type semiconductor layer may be formed by injecting at least one of TMGa gas, TMIn gas, TMAl gas, $NH_3$ gas, $N_2$ gas, and $H_2$ gas is injected in a chamber, but the embodiment is not limited thereto.

For example, the non-conductive type semiconductor layer may include a semiconductor material having a compositional formula of $In_xAl_yGa_{1-x-y}N$ ($0 \leq x \leq 1$, $0 \leq y \leq 1$, $0 \leq x+y \leq 1$), and is not doped with N type dopants. The non-conductive type semiconductor layer has electrical conductivity remarkably lower than that of the first conductive type semiconductor layer.

The active layer 140 may be formed on the first semiconductor layer 130. The active layer 140 may include a semiconductor material having a compositional formula of $In_xAl_yGa_{1-x-y}N$ ($0 \leq x \leq 1$, $0 \leq y \leq 1$, $0 \leq x+y \leq 1$). The active layer 140 may include a single quantum well structure, a multiple quantum well (MQW) structure, a quantum dot structure, or a quantum wire structure.

For example, if the MOCVD scheme is used, the active layer 140 may include a MQW structure having an InGaN/GaN structure formed by injecting at least one of TMGa gas, TMIn gas, $NH_3$ gas, and $N_2$ gas into the chamber.

The active layer 140 may have a stack structure of a well/barrier layer by using a compound semiconductor material of group III to V elements. The well layer may include a semiconductor layer having a compositional formula of $In_xAl_yGa_{1-x-y}N$ ($0 \leq x \leq 1$, $0 \leq y \leq 1$, $0 \leq x+y \leq 1$), and the barrier layer may include a semiconductor layer having a compositional formula of $In_xAl_yGa_{1-x-y}N$ ($0 \leq x \leq 1$, $0 \leq y \leq 1$, $0 \leq x+y \leq 1$). For example, the active layer 140 may have the stack structure of InGaN well/GaN barrier layers, InGaN well/AlGaN barrier layers, or InGaN well/InGaN barrier layers. The band gap energy of the barrier layer may be higher than the band gap energy of the well layer.

A conductive clad layer may be formed on and/or under the active layer 140, and may include a nitride-based semiconductor. The band gap of the conductive clad layer may be higher than the band gap of the barrier layer.

The active layer 40 can generate the light due to the energy occurring in the recombination of electrons and holes supplied from the first and second conductive type semiconductor layers 130 and 150.

The second conductive type semiconductor layer 150 may be formed on the active layer 140. The second conductive type semiconductor layer 150 may include at least one P type semiconductor layer. The P type semiconductor layer may include a semiconductor material having a compositional formula of $In_xAl_yGa_{1-x-y}N$ ($0 \leq x \leq 1$, $0 \leq y \leq 1$, $0 \leq x+y \leq 1$). For example, the P type semiconductor layer may be selected from the group consisting of InAlGaN, GaN, AlGaN, InGaN, AlN, InN, and AlInN, and may be doped with P type dopants such as Mg, Zn, Ca, Sr, and Ba.

For example, if the MOCVD scheme is used, the second conductive type semiconductor layer 150 may be formed by injecting at least one of TMGa, TMIn, TMAl, $NH_3$, $N_2$, $H_2$ and $(EtCp_2Mg)\{Mg(C_2H_5C_5H_4)_2\}$ including P type dopants such as Mg, but the embodiment is not limited thereto.

Figure 2:
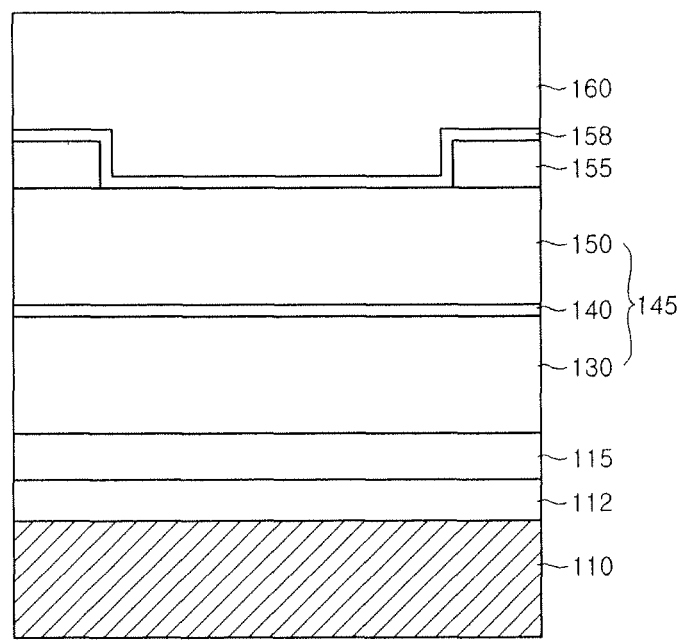

Referring to FIG. 2, a protective member 155 may be formed at an outer peripheral portion of a top surface of the light emitting structure 145, a reflective layer 158 may be formed on the light emitting structure 145 and the protective member 155, and a conductive support member 160 may be formed on the reflective layer 158.

The protective member 155 can prevent electrical short from occurring between the light emitting structure 145 and the conductive support member 160. An inner side portion of the protective member 155 is provided inward from a lateral surface of the light emitting structure 145, and an outer side portion of the protective member 155 is provided outward from the lateral surface of the light emitting structure 145. The protective member 155 may include a transmissive material or a transparent material, and may serve as a protective member in a channel region.

To this end, the protective member 155 may include a material having electrical conductivity. For example, the protective member 155 may be selected from the group consisting of $SiO_2$, $Si_xO_y$, $Si_3N_4$, $Si_xN_y$, $SiO_xN_y$, $Al_2O_3$, $TiO_2$, ITO, AZO, and ZnO. In addition, the thickness of the protective member 155 is in the range of about 0.5 μm to about 100 μm. The protective member 155 may be formed through a deposition scheme or a photolithography scheme, but the embodiment is not limited thereto.

The reflective layer 158 may be formed on the protective member 155 and the light emitting structure 145. The reflective layer 158 reflects light emitted from the light emitting structure 145, so that the light extraction efficiency of the light emitting device according to the embodiment can be improved.

The reflective layer 158 may include a material having high reflectance. For example, the reflective layer 158 may include metal including at least one of Ag, Al, Pt, Pd, and Cu, and the alloy thereof.

Meanwhile, if the reflective layer 158 does not make ohmic contact with the light emitting structure 145, an ohmic contact layer (not shown) may be additionally formed between the reflective layer 158 and the light emitting structure 145, but the embodiment is not limited thereto.

The conductive support member 160 may be formed on the reflective layer 158. The conductive support member 160 may support the light emitting device according to the embodiment and supply power. The conductive support member 160 may include at least one selected from the group consisting of Ti, Cr, Ni, Al, Pt, Au, W, Cu, Mo, and carrier wafers such as Si, Ge, GaAs, ZnO, SiC, SiGe, or GaN.

The reflective layer 158 and the conductive support member 160 may be formed through a deposition scheme, a plating scheme, and a photolithography scheme.

Figure 3:
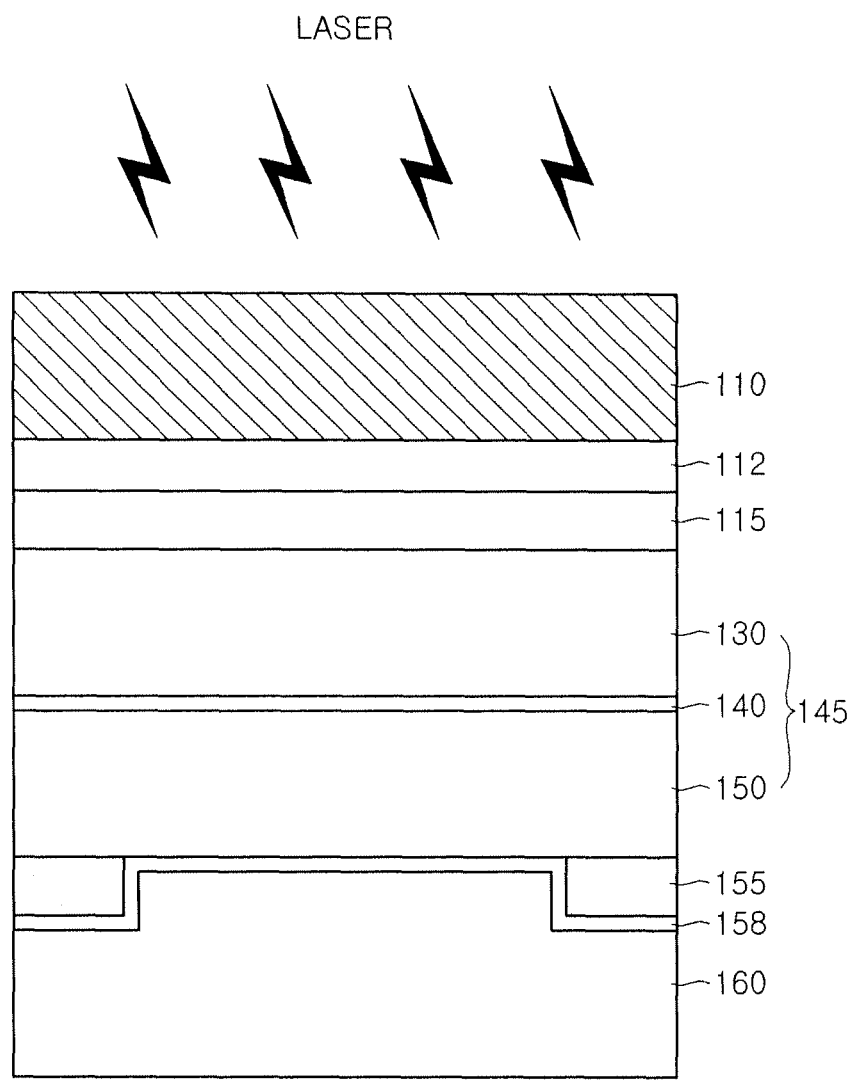
Figure 4:
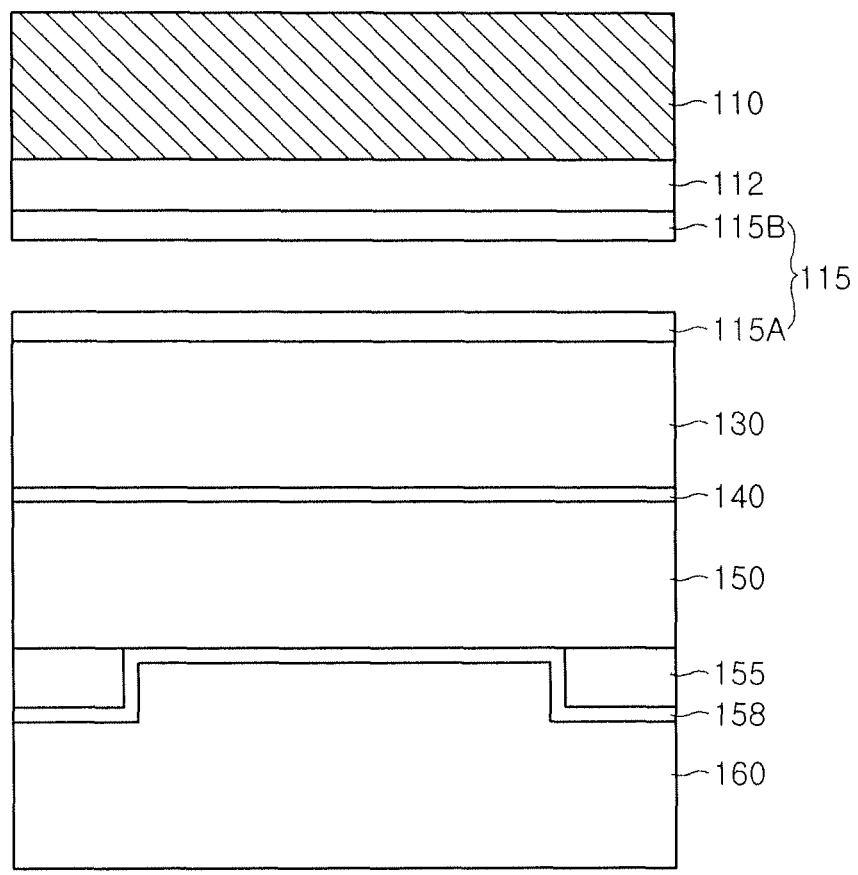

Referring to FIGS. 3 and 4, an LLO process is performed to separate the substrate 110 from the light emitting structure 145 by irradiating a laser beam into a lower surface of the light emitting device of FIG. 2, that is, the lower surface of the substrate 110.

The energy of the laser beam may be less than the band gap energy of the spreading layer 112, and greater than the band gap energy of the sacrificial layer 115. In this case, the energy of the laser varies according to wavelengths as shown in Table 1, and a proper laser beam may be selected according to the materials constituting of the spreading layer 112 and the sacrificial layer 115.

TABLE 1

| | Laser Wavelength (nm) | | | | | |
|---|---|---|---|---|---|---|
| | 193 | 248 | 266 | 355 | 532 | 1064 |
| Laser Energy (eV) | 6.4 | 5 | 4.7 | 3.5 | 2.3 | 1.2 |

As the laser beam is irradiated, the laser beam energy is converted into thermal energy by the spreading layer 112, and the thermal energy decomposes the sacrificial layer 115 having less band gap energy. That, $In_xAl_yGa_{1-x-y}N$ ($0 \le x \le 1$, $0 \le y \le 1$, $0 \le x+y \le 1$) constituting the sacrificial layer 115 is decomposed into In, Al, Ga and $N_2$ due to the thermal energy. Accordingly, the sacrificial layer 115 is removed, so that the substrate 110 may be separated from the light emitting structure 145.

In detail, as shown in FIG. 4, a first part defined from the conductive support member 160 to the light emitting structure 145 may be separated from a second part defined from the spreading layer 112 to the substrate 110. In this case, a part 115A of the sacrificial layer having a thickness in the range of about 1 nm to about 99 nm may remain on the separation surface of the first and second parts (see reference numbers 115A and 115B).

In the case of the conventional LLO process, a laser beam is not uniformly irradiated onto the separation surface, so that the light emitting structure is damaged.

However, according to the embodiment, as described above, the energy of the laser beam converted into thermal energy by the spreading layer 112 having high thermal conductivity is uniformly spread and transferred to the sacrificial layer 115. The high bandgap energy of the spreading layer 112 can reduce the impact applied to the light emitting structure 145 by the laser beam. Therefore, according to the embodiment, the spreading layer 112 is formed, thereby minimizing the damage of the light emitting structure caused by the LLO process.

According to the embodiment, a substrate is not separated from the interface between the substrate and a nitride-based semiconductor layer, but interfaces among the nitride-based semiconductor layers 112, 115, and 130 are separated from each other, so that the substrate 110 can be removed. Accordingly, the damage of the substrate 110 is minimized, and the nitride semiconductor layer remaining on the substrate 110 is easily removed through an etching process, so that the substrate 110 can be reused.

Figure 5:
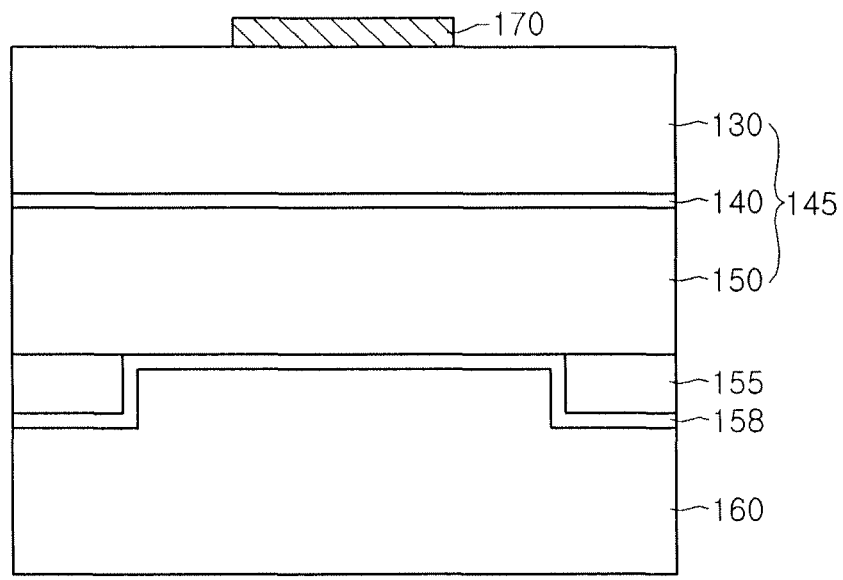

Referring to FIG. 5, an electrode 170 may be formed under the first semiconductor layer 130 exposed through the LLO process, thereby providing the light emitting device according to the embodiment. The electrode 170 may include a pad.

Meanwhile, before the electrode 170 is formed, an RIE/ICP (Reactive Ion Etch/Inductively Coupled Plasma) process to remove the non-conductive type semiconductor layer and the sacrificial layer 115 remaining after the LLO process may be performed, but the embodiment is not limited thereto.

For example, the electrode 170 may include at least one of Al, Ti, Cr, Ni, Cu, and Au, and may be formed through at least one of a deposition scheme, a plating scheme, and a photolithography scheme.

Figure 6:
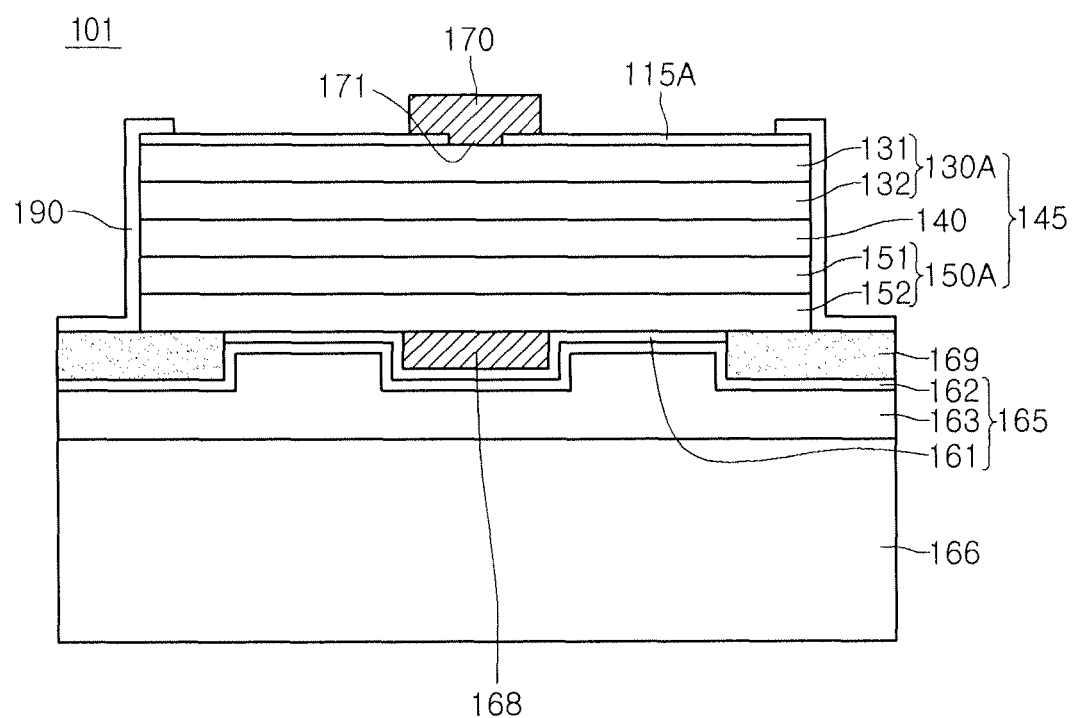
FIG. 6 is a side sectional view showing a light emitting device according to a second embodiment.

FIG. 6 is a side sectional view showing a light emitting device 101 according to the second embodiment.

Referring to FIG. 6, the light emitting device 101 includes the electrode 170, the sacrificial layer 115A, a first conductive type semiconductor layer 130A, the active layer 140, a second conductive type semiconductor layer 150A, a current blocking layer 168, a protective member 169, a conductive layer 165, and a support member 166.

The sacrificial layer 115A has a lattice constant value lower than that of the light emitting structure 145.

The sacrificial layer 115A may include a nitride semiconductor material having a compositional formula of $In_xAl_yGa_{1-x-y}N$ ($0.15 \le x \le 1$, $0 \le y \le 0.15$, $0 \le x+y \le 1$). Hereinafter, the sacrificial layer 115A may used as a nitride semiconductor layer for the purpose of explanation. For example, the band gap energy of the sacrificial layer 115A may be in the range of about 1 eV to about 4 eV, preferably, in the range of about 1 eV to about 3 eV.

The sacrificial layer 115A may include a material having band gap energy lower than band gap energy of the light emitting structure 145. For example, the band gap energy of the sacrificial layer 115A is lower than band gap energy of a GaN-based semiconductor layer. The GaN-based semiconductor layer may be provided on the first conductive type semiconductor layer 130A, and has the band gap energy of about 3.39 eV.

Meanwhile, the sacrificial layer 115A may include at least one of InN and InGaN. In addition, the sacrificial layer 115A may include a plurality of layers, and the layers include a first layer including InN and a second layer including InGaN on the first layer, but the embodiment is not limited thereto.

The sacrificial layer 115A may have a thickness in the range of about 1 nm to about 99 nm on the first conductive type semiconductor layer 130A. Preferably, the sacrificial layer 115A may have a thickness in the range of about 1 nm to about 50 nm.

The electrode 170 may be connected to the first conductive type semiconductor layer 130A, and may make contact with the sacrificial layer 115A. A part 171 of the electrode 170 is connected to the first conductive type semiconductor layer 130A through the inner part of the sacrificial layer 115A. The width or the area of the electrode 170 may be less than the width or the area of the sacrificial layer 115A. For example, the width or the area of the electrode 170 may be formed to 10% or less of the width or the area of the sacrificial layer 115A.

In this case, the sacrificial layer 115A may include an undoped semiconductor layer having conductivity lower than that of the first conductive type semiconductor layer 130A or a semiconductor layer doped with first conductive dopants, but the embodiment is not limited thereto. The width of the sacrificial layer 115A may be identical to or different from the width of the first conductive type semiconductor layer 130A, but the embodiment is not limited thereto.

The first conductive type semiconductor layer 130A includes a second semiconductor layer 131 under the sacrificial layer 115A and a third semiconductor layer 132 under the second semiconductor layer 131.

The second and third semiconductor layers 131 and 132 may include a semiconductor layer having a compositional formula of $In_xAl_yGa_{1-x-y}N$ ($0 \le x \le 1$, $0 \le y \le 1$, $0 \le x+y \le 1$). The second and third semiconductor layers 131 and 132 include first conductive dopants, and the first conductive dopants may include N type dopants.

At least one of the second and third semiconductor layers 131 and 132 includes a material having band gap energy lower than the band gap energy of the sacrificial layer 115A. For example, at least one of the second and third semiconductor layers 131 and 132 may include at least one of GaN, AlGaN, and AlInGaN.

The second semiconductor layer 131 is a semiconductor layer having dopant concentration higher than that of the third semiconductor layer 132, and the third semiconductor layer 132 has conductivity lower than that of the second semiconductor layer 131. The second semiconductor layer 131 can horizontally spread current, and the third semiconductor layer 132 serves as a high resistance layer such that current can be spread within the second semiconductor layer 131.

The second semiconductor layer 131 and the third semiconductor layer 132 may have a superlattice structure formed by staking semiconductor layers having different band gaps. The supperlattice structure includes a GaN/InGaN structure or a GaN/AlGaN structure. The supperlattice structure may include a structure in which at least two pairs of two different layers having a thickness of a few Å or more are alternately stacked.

The second and third semiconductor layers 131 and 132 may have different refractive indexes. For example, the second semiconductor layer 131 has a lower refractive index, and the third semiconductor layer 132 may have a refractive index higher than that of the second semiconductor layer 131. The difference in the refractive index between the two layers can improve light extraction efficiency. In addition, the thickness of the second semiconductor layer 131 may be thicker than the thickness of the third semiconductor layer 131.

A top surface of the second semiconductor layer 131 and/or the sacrificial layer 115A may have a light extraction structure. The light extraction structure may include a concavo-convex structure or a roughness structure formed on the top surface of the second semiconductor layer 131. The light extraction structure may be patterned, and may include at least one a hemispherical shape, a polygonal shape, a triangular pyramid shape, and a nano-column shape. The light extraction structure formed on the first conductive type semiconductor layer 130A may change the critical angle of light incident into the first conductive type semiconductor layer 130A, so that the light extraction efficiency can be improved.

A current spreading layer may be additionally formed on the sacrificial layer 115A, and the current spreading layer includes metal oxide or metal nitride. For example, the current spreading layer may be selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), ITON (ITO nitride), IZON (IZO nitride), IrOx, RuOx, RuOx/ITO, Ni/IrOx/Au, and Ni/IrOx/Au/ITO, but the embodiment is not limited thereto. The current spreading layer may include transmissive conductive material.

The second conductive type semiconductor layer 150A includes a fourth semiconductor layer 151 and a fifth semiconductor layer 152, and the fourth and fifth semiconductor layers 151 and 152 may include a semiconductor layer having a compositional formula of $In_xAl_yGa_{1-x-y}N$ ($0 \leq x \leq 1$, $0 \leq y \leq 1$, $0 \leq x+y \leq 1$). The fourth and fifth semiconductor layers 151 and 152 may include a semiconductor layer doped with second conductive dopants, for example, a P type semiconductor layer doped with P type dopants.

The fifth semiconductor layer 152 includes a semiconductor layer having P type dopants with the concentration higher than the concentration of P type dopants of the fourth semiconductor layer 151, and the fourth semiconductor layer 151 has conductivity lower than that of the fifth semiconductor layer 152. The fourth semiconductor layer 151 can horizontally spread current and the fifth semiconductor layer 152 serves as a high resistance layer so that current can spread in the fourth semiconductor layer 151.

The thickness of the fourth semiconductor layer 151 may be thicker than the thickness of the fifth semiconductor layer 152, but the embodiment is not limited thereto.

The fourth semiconductor layer 151 and the fifth semiconductor layer 152 may have a superlattice structure formed by staking semiconductor layers having different band gaps. The supperlattice structure includes a GaN/InGaN structure or a GaN/AlGaN structure. The supperlattice structure may include a structure in which at least two pairs of two different layers having a thickness of a few Å or more are alternately stacked.

The fourth and fifth semiconductor layers 151 and 152 may have different refractive indexes. For example, the fourth semiconductor layer 151 has a lower refractive index, and the fifth semiconductor layer 152 may have a refractive index higher than that of the fourth semiconductor layer 151. After stacking at least two pairs of the fourth and fifth semiconductor layers 151 and 152, the stack structure may be used as a DBR (Distributed bragg reflector) structure.

The first conductive type semiconductor layer 130A, the active layer 140, and the second conductive type semiconductor layer 150A may be defined as the light emitting structure 145. In addition, in the light emitting structure 145, a semiconductor layer having polarity opposite to that of the second conductive type semiconductor layer 150A can be formed under the second conductive type semiconductor layer 150A, and the semiconductor layer may be a third conductive type semiconductor layer. The third conductive type semiconductor layer may be an N type semiconductor layer. In addition, the first conductive type semiconductor layer 130A may be a P type semiconductor layer, and the second conductive type semiconductor layer 130A may be an N type semiconductor. The light emitting structure 145 may include at least one of a P-N junction structure, an N-P junction structure, a P-N-P junction structure, and an N-P-N junction structure.

A conductive layer 165, a current blocking layer 168, and a protective member 169 are formed under the light emitting structure 145.

The conductive layer 165 includes a plurality of conductive layers 161, 162, and 163. In detail, the conductive layer 164 includes at least two layers. The conductive layers 161, 162, and 163 may serve as an electrode layer. Hereinafter, the conductive layer 165 will be described by using the first to third conductive layers 161, 162, and 163.

The first conductive layer 161 makes ohmic contact with the lower surface of the second conductive type semiconductor layer 150A, and includes at least one selected from the group consisting of ITO, IZO, IZTO, IAZO, IGZO, IGTO, AZO, ATO, GZO, ITON, IZON, IrOx, RuOx, RuOx/ITO, Ni/IrOx/Au, Ni/IrOx/Au/ITO, Pt, Ni, Au, Rh and Pd.

The second conductive layer 162 is provided under the first conductive layer 161 to serve as a reflective layer. The second conductive layer 162 may include at least one of Ag, Ni, Al, Rh, Pd, Ir, Ru, Mg, Zn, Pt, Au, and Hf.

The second conductive layer 162 may extend from a lower surface of the first conductive layer 161 to a lower surface of the protective member 169.

The third conductive layer 163 is provided under the second conductive layer 162 to serve as a barrier layer or a bonding layer, and may include at least one selected from the group consisting of Sn, Ga, In, Bi, Cu, Ni, Ag, Mo, Al, Au, Nb, W, Ti, Cr, Ta, Al, Pd, Pt, Si, Al—Si, Ag—Cd, Au—Sb, Al—Zn, Al—Mg, Al—Ge, Pd—Pb, Ag—Sb, Au—In, Al—Cu—Si, Ag—Cd—Cu, Cu—Sb, Cd—Cu, Al—Si—Cu, Ag—Cu, Ag—Zn, Ag—Cu—Zn, Ag—Cd—Cu—Zn, Au—Si, Au—Ge, Au—Ni, Au—Cu, Au—Ag—Cu, Cu—Cu2O, Cu—Zn, Cu—P, Ni—B, Ni—Mn—Pd, Ni—P, and Pd—Ni. In addition, the third conductive layer 163 may have a single layer structure or a multiple layer structure.

The support member 166 may be formed under the third conductive layer 163. The support member 166 may include a conductive material. For example, the support member 166 may include a material such as Cu, Ag, carrier wafer (e.g., Ge, GaAs, ZnO, SiC, or SiGe). The thickness of the support member 166 may be in the range of about 30 μm to about 500 μm, but the embodiment is not limited thereto.

According to another embodiment, the support member 166 may include a conductive sheet or an insulating material.

The current blocking layer 168 is interposed between the second conductive type semiconductor layer 150A and the first conductive layer 161. The current blocking layer 168 may overlap with the electrode 170 perpendicularly to the electrode 170 or may overlap with the electrode 170 a thickness direction of the light emitting structure 145. The current blocking layer 168 may have an area at least wider than that of the electrode 170. The perpendicular direction may be a thickness direction of the light emitting structure 145.

The current blocking layer 168 may include at least one selected from the group consisting of $SiO_2$, $SiO_x$, $SiO_xN_y$, $Si_3N_4$, $Al_2O_3$, and $TiO_2$, but the embodiment is not limited thereto. The current blocking layer 168 may include a material forming schottky contact, but the embodiment is not limited thereto.

The protective member 169 is provided at an outer peripheral portion of the light emitting structure 145, and may have a loop shape or a frame shape.

An inner side portion of the protective member 169 is interposed between the second conductive type semiconductor layer 150A and the first conductive layer 161, and an outer side portion of the protective member 169 extends outward from the lateral surface of the light emitting structure 145. A lower surface of the outer portion of the protective member 169 may make contact with the top surface of the first conductive layer 161. The protective member 169 may include an insulating material or a conductive oxide material. For example, the protective member 169 may be selected from the group consisting of ITO, IZO, IZON, IZTO, IAZO, IGZO, IGTO, AZO, ATO, GZO, $SiO_2$, $SiO_x$, $SiO_xN_y$, $Si_3N_4$, $Al_2O_3$, and $TiO_2$.

The protective member 169 may space the light emitting structure 145 apart from another conductive layer. In addition, the protective member 169 can improve the adhesive strength with the second conductive type semiconductor layer 150A.

An insulating layer 190 is provided at the lateral surface of the light emitting structure 145, and may extend from a top surface of the protective member 169 to the top surface of the sacrificial layer 115A. The insulating layer 190 is provided at an outer peripheral portion of the top surface of the sacrificial layer 115A, thereby preventing the sacrificial layer 115A from being peeled.

Figure 7:
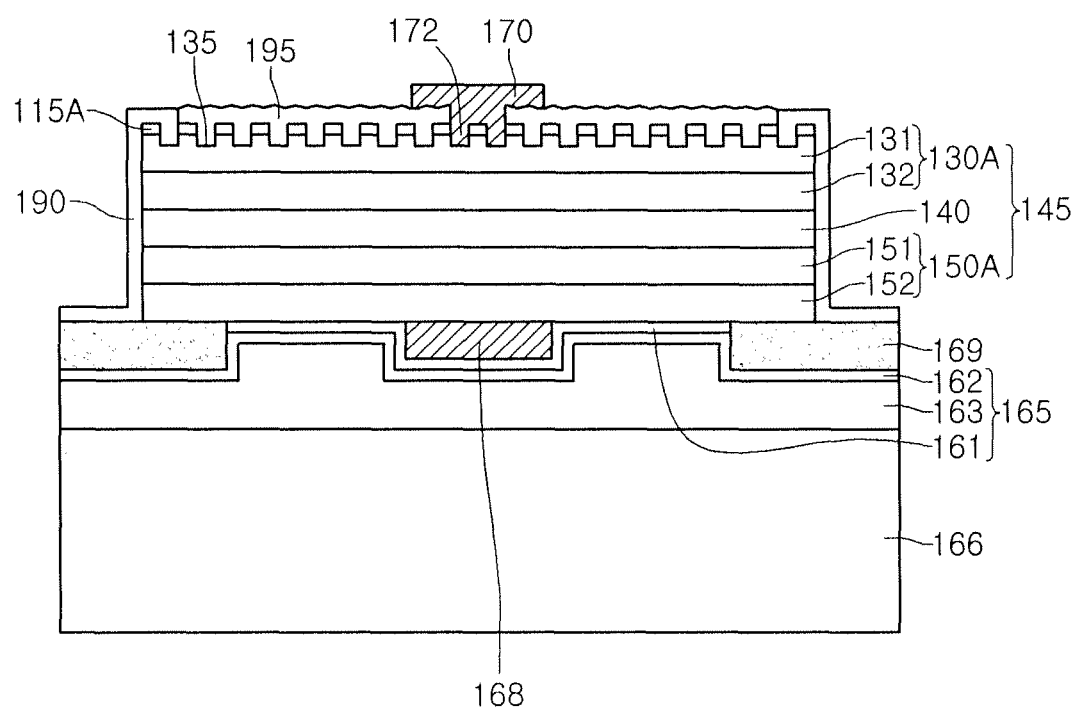
FIG. 7 is a side sectional view showing a light emitting device according to a third embodiment.

FIG. 7 is a side sectional view showing a light emitting device according to a third embodiment.

Referring to FIG. 7, the light emitting device may include a light extraction structure 135 formed on the sacrificial layer 115A and the first conductive type semiconductor layer 130A. The light extraction structure 135 is formed by alternately arranging concave parts and convex parts, and may be formed through a wet etching process and/or a dry etching process. The sectional shape of the light extraction structure 135 may include a polygonal shape, a triangular pyramid shape, and a column shape. The concave and convex patterns may be arranged at a regular interval or an irregular interval, but the embodiment is not limited thereto.

When viewed in a plan view, the concavo-convex shape of the light extraction structure 135 may have a matrix shape, a strip shape, or a dot shape, but the embodiment is not limited thereto.

The sacrificial layer 115A may have a thickness in the range of about 1 nm to about 99 nm on the first conductive type semiconductor layer 130A. Preferably, the sacrificial layer 115A may have a thickness in the range of about 1 nm to about 50 nm. The sacrificial layer 115A includes an InN layer and/or an InGaN layer.

The sacrificial layer 115A includes a plurality of holes, and the holes serve as the concave parts of the light extraction structure 135. The holes may be arranged in an irregular form. The concave parts of the light extraction structure 135 may be formed lower than the top surface of the first conductive type semiconductor layer 130A. Accordingly, the first conductive type semiconductor layer 130A is exposed through the holes, and a stepped surface may be exposed lower than the top surface of the first conductive type semiconductor layer 130A, thereby improving light extraction efficiency.

A current spreading layer 195 may be formed on the sacrificial layer 115A. The current spreading layer 195 may be formed corresponding to at least 50% of the area of the top surface of the sacrificial layer 115A.

The current spreading layer 195 includes a conductive oxide material or a conductive nitride material. For example, the current spreading layer 195 includes a material having a refractive index lower than that of the light emitting structure 135. The current spreading layer 195 includes a material having a refractive index lower than that of the sacrificial layer 115A. The current spreading layer 195 may be selected from the group consisting of ITO, IZO, IZTO, IAZO, IGZO, IGTO, AZO, ATO, GZO, ITON, IZON, IrOx, RuOx, RuOx/ITO, Ni/IrOx/Au, and Ni/IrOx/Au/ITO, but the embodiment is not limited thereto. The current spreading layer 195 may include transmissive conductive material.

A part of the current spreading layer 195 may make contact with the upper portion of the first conductive type semiconductor layer 130A. For example, the part of the current spreading layer 195 may make contact with the upper portion of the first conductive type semiconductor layer 130A through the concave parts of the light extraction structure 135.

The electrode 170 is provided on the sacrificial layer 115A. At least a part 172 of the electrode 170 may make contact with the second semiconductor layer 131 of the first conductive type semiconductor layer 130A and the current spreading layer 195. At least the part 172 of the electrode 170 may make contact with different parts of the second semiconductor layer 131, but the embodiment is not limited thereto.

The current spreading layer 195 may serve as a concavo-convex layer by the light extraction structure 135, thereby improving light extraction efficiency.

A part of the current spreading layer 195 may further make contact with the upper portion of the first conductive type semiconductor layer 130A through the holes of the sacrificial layer 115A, but the embodiment is not limited thereto.

Figure 8:
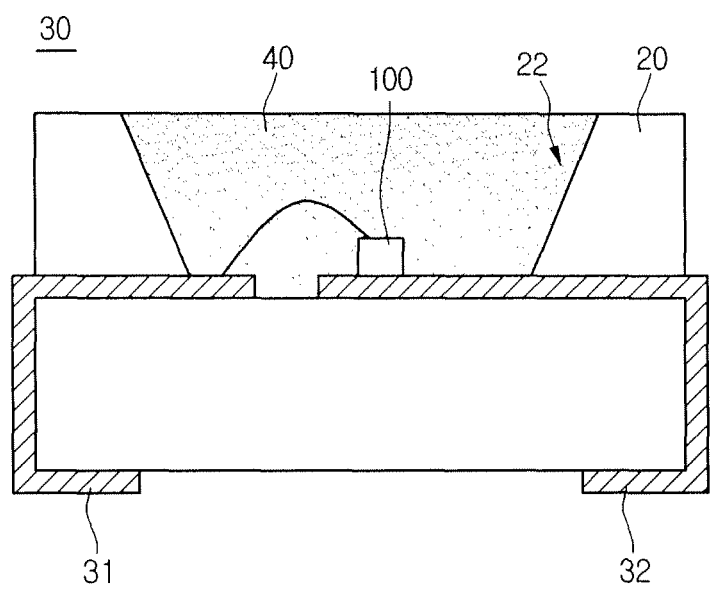
FIG. 8 is a sectional view showing a light emitting device package including a light emitting device according to the embodiment.

FIG. 8 is a sectional view showing a light emitting package including the light emitting device of FIG. 5.

Referring to FIG. 8, the light emitting device package 30 according to the embodiment includes a body 20, first and second lead electrodes 31 and 32 formed on the body 20, a light emitting device 100, which is provided on one of the first and second lead electrodes 31 and 32, electrically connected to the first and second lead electrodes 31 and 32, and manufactured according to the method of manufacturing the light emitting device 100 according to the embodiment, and a molding member 40 that surrounds the light emitting device 100.

The body 20 may include silicon, synthetic resin or metallic material. Inclined surfaces may be formed around the light emitting device 100.

The first and second lead electrodes 31 and 32 include a metallic layer formed through a lead frame or a plating process, and are electrically isolated from each other. The first and second lead electrodes 31 and 32 are mounted on a PCB (Printed Circuit Board) to supply power to the light emitting device 100. The first and second lead electrodes 31 and 32 reflect light emitted from the light emitting device 100 to increase light efficiency, and discharge heat emitted from the light emitting device 100 to the outside.

The light emitting device 100 is provided on the second lead electrode 32 so that the light emitting device 100 can be electrically connected to the conductive support member of FIG. 5.

The light emitting device 100 may be electrically connected to the first electrode 31 through a wire, but the embodiment is not limited thereto.

The molding member 40 surrounds the light emitting device 100 to protect the light emitting device 100. In addition, the molding member 40 may include luminescence material to change the wavelength of the light emitted from the light emitting device 100.

A lens may be additionally provided on the molding member 40. The lens may have a concave lens shape, a convex lese shape, or the mixture of the concave and convex shapes, but the embodiment is not limited thereto.

<Lighting System>

The light emitting device or the light emitting device package according to the embodiment is applicable to a lighting system. The lighting system has a structure in which a plurality of light emitting devices or a plurality of light emitting device packages are arranged. In addition, the lighting system may include an illumination lamp, a signal lamp, a headlight of a vehicle, and an electric sign board.

Figure 9:
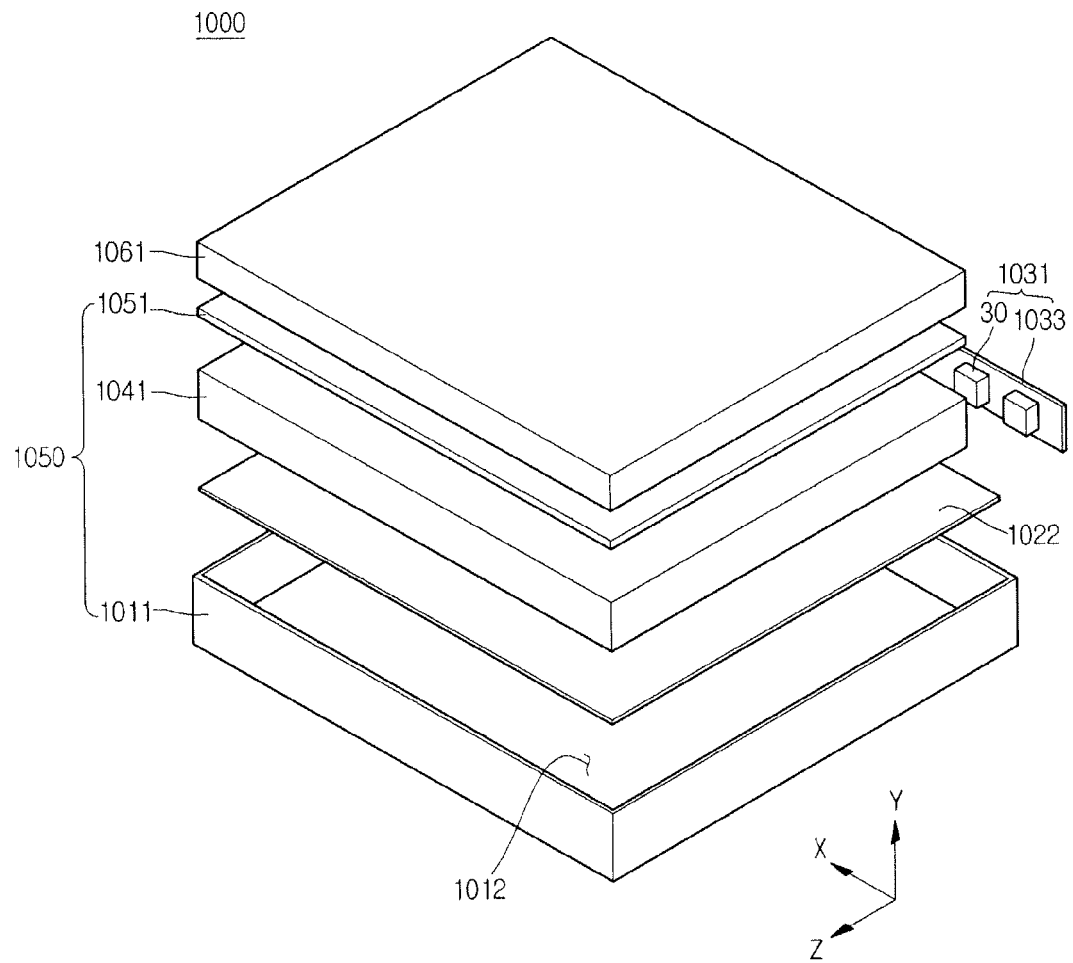
FIG. 9 is a view showing a display device according to the embodiment.
Figure 10:
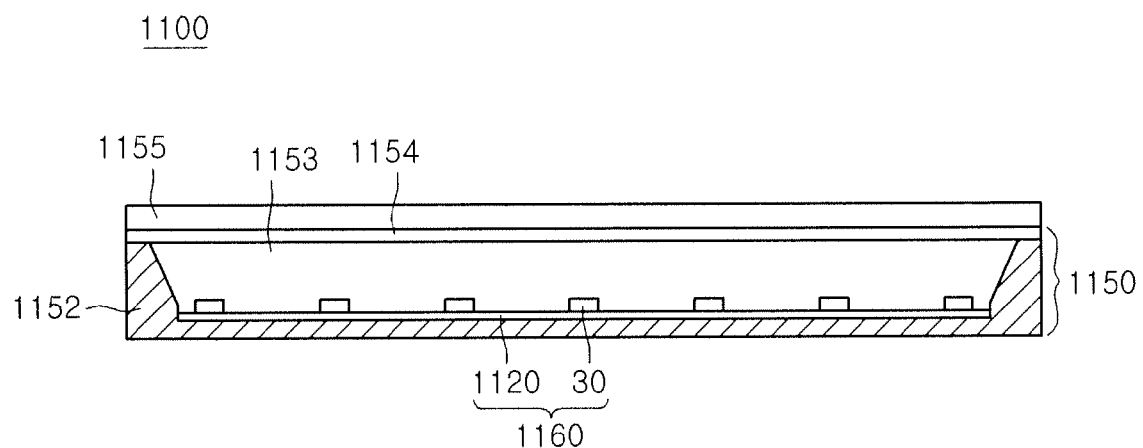
FIG. 10 is a view showing another example of a display apparatus according to the embodiment.
Figure 11:
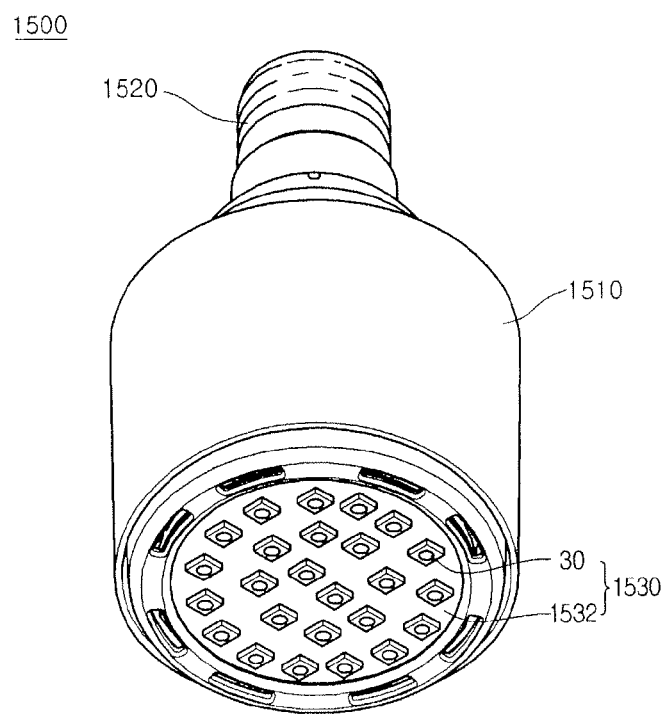
FIG. 11 is a view showing a lighting device according to the embodiment.

The lighting system may include a display apparatus shown in FIGS. 9 and 10, a lighting device shown in FIG. 11, in addition to a lighting lamp, a signal light, a vehicle headlight, an electronic display, etc.

FIG. 9 is a disassembled perspective view of a display apparatus according to an embodiment.

Referring to FIG. 9, the display apparatus 1000 according to the embodiment may include a light guide panel 1041, a light emitting module 1031 supplying light to the light guide panel 1041, a reflective member 1022 under the light guide panel 1041, an optical sheet 1051 on the light guide panel 1041, a display panel 1061 on the optical sheet 1051, and a bottom cover 1011 receiving the light guide panel 1041, the light emitting module 1031, and the reflective member 1022, but the present disclosure is not limited thereto.

The bottom cover 1011, the reflective sheet 1022, the light guide panel 1041, and the optical sheet may be defined as a light unit 1041.

The light guide panel 1041 functions to transform linear light to planar light by diffusing the linear light. The light guide panel 1041 may be made of a transparent material, and may include one of acryl-series resin such as polymethyl metaacrylate (PMMA), polyethylene terephthlate (PET), poly carbonate (PC), COC, and polyethylene naphthalate resin.

The light emitting module 1031 provides light to at least a side surface of the light guide panel 1041, and finally acts as a light source of a display apparatus.

The light emitting module 1031 may include at least one light emitting module, and provide light directly or indirectly from one side surface of the light guide panel 1041. The light emitting module 1031 may include a board 1033, and a light emitting device package 30 according to embodiments disclosed above, and the light emitting device packages 30 may be arranged apart by a predetermined interval from each other on the board 1033.

The board 1033 may be a printed circuit board (PCB) including a circuit pattern (not shown). The board 1033 may include a metal core PCB (MCPCB), a flexible PCB (FPCB), etc. as well as the general PCB, but the present disclosure is not limited thereto. In the case where the light emitting device package 30 is mounted on a side surface or a heat releasing plate, the board 1033 may be removed. Herein, some of the heat releasing plate may contact an upper surface of the bottom cover 1011.

The plurality of light emitting device packages 30 may be mounted on the board 1033 such that light emitting surfaces of the plurality of light emitting device packages 30 are spaced apart by a predetermined distance from the light guide panel 1041, but the present disclosure is not limited thereto. The light emitting device package 30 may supply light to a light incident part that is one side surface of the light guide panel 1041, directly or indirectly, but the present disclosure is not limited thereto.

The reflective member 1022 may be provided under the light guide panel 1041. The reflective member 1022 reflects light incident from a lower surface of the light guide panel 1041 to allow the reflected light to be directed toward an upper direction, thereby capable of enhancing brightness of the light unit 1050. The reflective member 1022 may be formed of, for example, PET, PC, PVC resin, or the like, but the present disclosure is not limited thereto.

The bottom cover 1011 may receive the light guide panel 1041, the light emitting module 1031, the reflective member 1022, and the like. For this purpose, the bottom cover 1011 may have a receiving part 1012 formed in a box shape a top surface of which is opened, but the present disclosure is not limited thereto. The bottom cover 1011 may be coupled to a top cover, but the present disclosure is not limited thereto.

The bottom cover 1011 may be formed of a metal material or resin material, and may be manufactured by using a process such as a press molding or an injection molding. Also, the bottom cover 1011 may include metallic or nonmetallic material having a high thermal conductivity, but the present disclosure is not limited thereto.

The display panel 1061 is, for example, an LCD panel, and includes first and second transparent substrates facing each other, and a liquid crystal layer interposed between the first and second substrates. A polarizing plate may be attached on at least one surface of the display panel 1061, but the present disclosure is not limited thereto. The display panel 1061 displays information by using light passing through the optical sheet 1051. The display apparatus 1000 may be applied to a variety of mobile terminals, monitors for notebook computers, monitors for lap-top computers, televisions, etc.

The optical sheet 1051 is disposed between the display panel 1061 and the light guide panel 1041, and includes at least one transparent sheet. The optical sheet 1051 may include, for example, at least one of a diffusion sheet, a horizontal and/or vertical prism sheet, and a brightness reinforcing sheet. The diffusion sheet diffuses incident light, the horizontal and/or vertical prism sheet focuses incident light on a display region, and the brightness reinforcing sheet enhances the brightness by reusing lost light. Also, a protective sheet may be disposed on the display panel 1061, but the present disclosure is not limited thereto. Herein, the display apparatus 1000 may include the light guide panel 1041, and the optical sheet 1051 as optical members positioned on a light path of the light emitting module 1031, but the present disclosure is not limited thereto.

FIG. 10 is a cross-sectional view of a display apparatus according to an embodiment.

Referring to FIG. 10, the display apparatus 1100 includes a bottom cover 1152, a board 1120 on which the light emitting device packages 30 disclosed above are arrayed, an optical member 1154, and a display panel 1155.

The board 1120 and the light emitting device package 30 may be defined as a light emitting module 1060. The bottom cover 1152, the at least one light emitting module 1060, and the optical member 154 may be defined as a light unit.

The bottom cover 1152 may be provided with a receiving part, but the present disclosure is not limited thereto.

Herein, the optical member 1154 may include at least one of a lens, a light guide panel, a diffusion sheet, a horizontal and vertical prism sheet, and a brightness reinforcing sheet. The light guide panel may be formed of polycarbonate (PC) or poly methyl methacrylate (PMMA), and may be removed. The diffusion sheet diffuses incident light, the horizontal and vertical prism sheet focuses incident light on a display region, and the brightness reinforcing sheet enhances the brightness by reusing lost light.

The optical member 1154 is disposed on the light emitting module 1060. The optical member 154 transforms light emitted from the light emitting module 1060 to planar light, and performs diffusion, light focusing, and the like.

FIG. 11 is a perspective view of a lighting device according to an embodiment.

Referring to FIG. 11, the lighting unit 1500 may include a case 1510, a light emitting module 1530 equipped in the case 1510, and a connection terminal 1520 equipped in the case 1510 and supplied with an electric power from an external power supply.

The case 1510 may be preferably formed of a material having good heat shielding characteristics, for example, a metal material or a resin material.

The light emitting module 1530 may include a board 1532, and at least one light emitting device package 30 according to the embodiments mounted on the board 1532. The light emitting device package 30 may include a plurality of light emitting device packages which are arrayed apart by a predetermined distance from one another in a matrix configuration.

The board 1532 may be an insulator substrate on which a circuit pattern is printed, and may include, for example, a printed circuit board (PCB), a metal core PCB, a flexible PCB, a ceramic PCB, an FR-4 substrate, etc.

Also, the board 1532 may be formed of a material to efficiently reflect light, and a surface thereof may be formed in a color capable of efficiently reflecting light, for example, white color, or silver color.

The at least one light emitting device packages 30 may be mounted on the board 1532. Each of the light emitting device packages 30 may include at least one light emitting diode (LED) chip. The LED chip may include a color LED emitting red, green, blue or white light, and a UV LED emitting ultraviolet (UV).

The light emitting module 1530 may have a combination of various light emitting device packages so as to obtain desired color and luminance. For example, the light emitting module 1530 may have a combination of a white LED, a red LED, and a green LED so as to obtain a high color rendering index (CRI).

The connection terminal 1520 may be electrically connected to the light emitting module 1530 to supply power. The connection terminal 1520 may be screwed and coupled to an external power in a socket type, but the present disclosure is not limited thereto. For example, the connection terminal 1520 may be made in a pin type and inserted into an external power, or may be connected to the external power through a power line.

The package of the light emitting device 100 may be arranged on the substrate to realize the light emitting module. In addition, after the light emitting device is provided on the substrate, the resultant structure may be packaged to realize the light emitting module.

As described above, according to the embodiment, after packages of the light emitting device have been arranged on the substrate, the resultant structure may be realized as a light emitting module. After the light emitting devices have been arranged on the substrate, the resultant structure may be packaged and realized as the light emitting module.

The embodiment can provide a light emitting device and a light emitting device package in which the reliability for the separation process of a growth substrate can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a nitride semiconductor layer;
   an electrode on a top surface of the nitride semiconductor layer;
   a light emitting structure under a bottom surface of the nitride semiconductor layer, the light emitting structure including a first conductive type semiconductor layer at the bottom surface of the nitride semiconductor layer, a second conductive type semiconductor layer, and an active layer between the first and the second conductive type semiconductor layers; and a conductive layer under a bottom surface of the light emitting structure, wherein the nitride semiconductor layer has a band gap energy lower than a band gap energy of the first conductive type semiconductor layer, wherein the nitride semiconductor layer is directly contacted with a top surface of the first conductive type semiconductor layer, wherein the electrode is directly contacted with the nitride semiconductor layer and the first conductive type semiconductor layer, wherein a top surface of the conductive layer is directly contacted with a bottom surface of the second conductive type semiconductor layer, wherein the nitride semiconductor layer includes a semiconductor having a compositional formula of $In_xAl_yGa_{1-x-y}N$ ($0.15<x<1, 0<y<0.15, 0<x+y<1$), wherein the first conductive type semiconductor layer includes an n-type semiconductor layer and the second conductive type semiconductor layer includes a p-type semiconductor layer, wherein the nitride semiconductor layer is formed of a semiconductor layer having a conductivity lower than that of the first conductive type semiconductor layer.

2. The light emitting device of claim 1, wherein the band gap energy of the nitride semiconductor layer is in a range of about 1 eV to about 3 eV.

3. The light emitting device of claim 1, wherein the nitride semiconductor layer has a thickness in a range of about 1 nm to about 99 nm.

4. The light emitting device of claim 1, wherein the first conductive type semiconductor layer includes a first semiconductor layer under the nitride semiconductor layer; and a second semiconductor layer under the first semiconductor layer, and wherein the first semiconductor layer has a band gap energy higher than the band gap energy of the nitride semiconductor layer.

5. The light emitting device of claim 1, further comprising a light extraction structure on at least one of the nitride semiconductor layer and the first conductive type semiconductor layer.

6. The light emitting device of claim 1, wherein the nitride semiconductor layer includes a plurality of holes, and a stepped surface lower than a top surface of the first conductive type semiconductor layer is exposed through the holes.

7. The light emitting device of claim 1, further comprising a current spreading layer on the top surface of the nitride semiconductor layer and the top surface of the first conductive type semiconductor layer, wherein the electrode is directly contacted with the current spreading layer.

8. The light emitting device of claim 1, further comprising a support member under a bottom surface of the conductive layer;

a protective layer at an outer peripheral portion between the conductive layer and the light emitting structure; and a current blocking layer disposed between the conductive layer and the light emitting structure and corresponding to the electrode with respect to a thickness direction of the light emitting structure.

9. The light emitting device of claim 1, wherein the nitride semiconductor layer includes an InN layer.

10. The light emitting device of claim 1, wherein the nitride semiconductor layer includes an InGaN layer.

11. A light emitting device comprising:

a nitride semiconductor layer including a plurality of holes;

a current spreading layer on a top surface of the nitride semiconductor layer;

an electrode on a top surface of the current spreading layer;

a light emitting structure under a bottom surface of the nitride semiconductor layer, the light emitting structure including a first conductive type semiconductor layer of the bottom surface of the nitride semiconductor layer, a second conductive type semiconductor layer, and an active layer between the first and a second conductive type semiconductor layers; and a conductive layer under the light emitting structure, the conductive layer including a reflective layer, wherein the nitride semiconductor layer has a band gap energy lower than a band gap energy of the first conductive type semiconductor layer, wherein the nitride semiconductor layer is directly contacted with a top surface of the first conductive type semiconductor layer, wherein the electrode is directly contacted with the nitride semiconductor layer and the first conductive type semiconductor layer, wherein a top surface of the conductive layer is directly contacted with a bottom surface of the second conductive type semiconductor layer, wherein the nitride semiconductor layer includes a semiconductor having a compositional formula of $In_xAl_yGa_{1-x-y}N$ ($0.15<x<1, 0<y<0.15, 0<x+y<1$), wherein the first conductive type semiconductor layer includes an n-type semiconductor layer and the second conductive type semiconductor layer includes a p-type semiconductor layer, wherein the nitride semiconductor layer is formed of an undoped semiconductor layer, wherein the nitride semiconductor layer has a thickness in a range of about 1 nm to about 99 nm.

12. The light emitting device of claim 11, wherein the top surface of the nitride semiconductor layer and the top surface of the first conductive type semiconductor layer include a light extraction structure.

13. The light emitting device of claim 11, further comprising an insulating layer disposed at a lateral surface of the light emitting structure, wherein a portion of the insulating layer contacts with a top surfaces of the nitride semiconductor layer and the first conductive type semiconductor layer.

14. The light emitting device of claim 11, wherein the electrode is directly contacted with the nitride semiconductor layer, the first conductive type semiconductor layer, and the current spreading layer.

15. The light emitting device of claim 11, further comprising a conductive support member under a bottom surface of the conductive layer;

a protective layer at an outer peripheral portion between the conductive layer and the light emitting structure; and a current blocking layer disposed between the conductive layer and the light emitting structure, the current blocking layer corresponding to the electrode with respect to a thickness direction of the light emitting structure.

16. The light emitting device of claim 11, wherein the nitride semiconductor layer includes an InN layer and/or an InGaN layer, and wherein the band gap energy of the nitride semiconductor layer is in a range of about 1 eV to about 3 eV.

17. The light emitting device of claim 16, wherein the nitride semiconductor layer has the thickness in a range of about 1 nm to about 50 nm.

18. The light emitting device of claim 15, wherein the conductive layer includes a contact layer between the second conductive type semiconductor layer and the reflective layer; and a bonding layer between the reflective layer and the conductive support member.

19. The light emitting device of claim 11, wherein the nitride semiconductor layer has a lattice constant lower than that of the first conductive type semiconductor layer.

20. A light emitting device package comprising:
a body;
a first and a second lead electrodes on the body;
a light emitting device on at least one of the first and the second lead electrodes; and
a molding member covering the light emitting device,
wherein the light emitting device comprises:
    a nitride semiconductor layer;
    an electrode on a top surface of the nitride semiconductor layer;
    a light emitting structure under a bottom surface of the nitride semiconductor layer, the light emitting structure including a first conductive type semiconductor layer, a second conductive type semiconductor layer, and an active layer between the first and a second conductive type semiconductor layers; and
    a conductive layer under a bottom surface of the light emitting structure,
wherein the nitride semiconductor layer has a band gap energy lower than a band gap energy of the first conductive type semiconductor layer,
wherein the nitride semiconductor layer is directly contacted with the first conductive type semiconductor layer,
wherein the electrode is directly contacted with the nitride semiconductor layer and the first conductive type semiconductor layer,
wherein a top surface of the conductive layer is directly contacted with a bottom surface of the second conductive type semiconductor layer,
wherein the nitride semiconductor layer includes a semiconductor having a compositional formula of $In_xAl_yGa_{1-x-y}N$ ($0.15 < x < 1$, $0 < y < 0.15$, $0 < x+y < 1$),
wherein the first conductive type semiconductor layer includes an n-type semiconductor layer and the second conductive type semiconductor layer includes a p-type semiconductor layer,
wherein the nitride semiconductor layer is formed of a semiconductor layer having conductivity lower than that of the first conductive type semiconductor layer.

* * * * *